(12) United States Patent
Robinson

(10) Patent No.: US 8,354,847 B2
(45) Date of Patent: Jan. 15, 2013

(54) ELECTROMETER WITH IN-MEASUREMENT RANGE ADJUSTMENT AND METHODS THEREOF FOR MEASURING ELECTROSTATIC CHARGE

(75) Inventor: Kelly S. Robinson, Fairpoint, NY (US)

(73) Assignee: Electrostatic Answers LLC, Fairport, NY (US)

( * ) Notice: Subject to any disclaimer, the term of this patent is extended or adjusted under 35 U.S.C. 154(b) by 1111 days.

(21) Appl. No.: 12/190,982

(22) Filed: Aug. 13, 2008

(65) Prior Publication Data

US 2009/0045816 A1 Feb. 19, 2009

Related U.S. Application Data

(60) Provisional application No. 60/956,004, filed on Aug. 15, 2007.

(51) Int. Cl.
*G01R 29/12* (2006.01)
(52) U.S. Cl. .......................... 324/458; 324/457
(58) Field of Classification Search .......... 324/457, 324/458
See application file for complete search history.

(56) References Cited

U.S. PATENT DOCUMENTS

| | | | |
|---|---|---|---|
| 4,050,019 A * | 9/1977 | Nirschl | 324/115 |
| 4,873,489 A | 10/1989 | Melcher et al. | |
| 5,235,385 A | 8/1993 | Rushing | |
| 5,719,502 A | 2/1998 | Verbiest et al. | |
| 6,462,552 B1 | 10/2002 | Suzuki | |
| 7,098,644 B1 * | 8/2006 | Denison | 324/72.5 |
| 7,230,431 B2 | 6/2007 | Mirme | |
| 7,238,936 B2 | 7/2007 | Okamura et al. | |
| 2005/0162173 A1 | 7/2005 | Mirme | |

OTHER PUBLICATIONS

Robinson et al., "Spark Protection Circuit for Measuring Current in High-Voltage Circuits", Journal of Electrostatics (63), 2005, pp. 285-296.
Acharya et al., "A Low-Current Logarithmic LED Electrometer", IEEE Transaction on Instrumentation and Measurement, vol. 49, No. 1, Feb. 2000, pp. 5-9.
Denison et al., "A Self-Resonant MEMS-Based Electrometer", IMTC 2007—IEE Instrumentation and Measurement Technology Conference, May 1-3, 2007, pp. 1-5.
Ericson et al., "A Wide-Range Logarithmic Electrometer with Improved Accuracy and Temperature Stability", IEEE, 1992, pp. 454-459.
Ericson et al., "A Wide-Range Logarithmic Electrometer with Improved Accuracy and Temperature Stability", IEEE Transactions on Instrumentation and Measurement, vol. 41, No. 6, Dec. 1992, pp. 968-973.

(Continued)

*Primary Examiner* — Amy He
(74) *Attorney, Agent, or Firm* — Electrostatic Answers LLC; Kelly S. Robinson

(57) ABSTRACT

An electrometer is disclosed. The electrometer has a high gain differential amplifier having a first input, a second input, and an output. The electrometer also has feedback switching circuitry. The electrometer further has a plurality of feedback elements configured to be selectively and cumulatively added in any parallel combination between the output and the first input of the high gain differential amplifier via the feedback switching circuitry. A method of adjusting a measurement range of an electrometer while the electrometer is being used to measure an electrostatic charge is also disclosed. One or more additional feedback elements are selectively added in parallel with one or more existing feedback elements which are coupled between an output and an input of a high gain differential amplifier of the electrometer.

6 Claims, 14 Drawing Sheets

OTHER PUBLICATIONS

Kim et al., "Performance Evaluation of an Electrometer", Proceedings of the 22nd Annual EMBS International Conference, Jul. 23-28, 2000, pp. 511-513.

Morin II et al., "An Absolute Charge Sensor for Fluid Electrification Measurements", IEEE Transactions on Electrical Insulation, vol. 26, No. 2, Apr. 1991, pp. 181-199.

Nils-Gunnar et al., "An Electrometer Amplifier with Low Input Capacitance and Large Input Dynamic Range", IEEE Transactions on Biomedical Engineering, Mar. 1972, pp. 162-164.

Park et al., "A Novel Ultrafine Particle Mesurement System with an Electrometer", IEEE, 2005, pp. 227-230.

Praglin et al., "High-Speed Electrometers for Rocket and Satellite Experiments", 1960, pp. 771-779.

Rietveld et al., "Vibration Reed Electrometer for Accurate Measurements of Electrical Currents Below 10pA", IEEE Transactions on Instrumentation and Measurement, vol. 56, No. 2, Apr. 2007, pp. 559-563.

Victoreen et al., "Electrometer Tubes for the Measurement of Small Currents", Proceeding of the I.R.E. Waves and Electrons Section, Apr. 1949 pp. 432-441.

Wickstrom et al., "A Simple, Inexpensive Electrometer Used to Measure Currents of Individual Silicon Vidicon Diodes in the 10-16 to 10-15 Ampere Range", IEEE Transactions on Electron Devices, Aug. 1970, pp. 634-636.

* cited by examiner

ELECTROMETER WITH IN-MEASUREMENT RANGE ADJUSTMENT AND METHODS THEREOF FOR MEASURING ELECTROSTATIC CHARGE

RELATED APPLICATION

This patent application claims priority to provisional U.S. Patent Application 60/956,004 filed on Aug. 15, 2007 and entitled, "AUTO-RANGING ELECTROMETER AND METHOD OF USE FOR MEASURING ELECTROSTATIC CHARGE." Provisional U.S. Patent Application 60/954,004 is hereby incorporated by reference in its entirety.

FIELD

The claimed invention generally relates to a device for measuring electrostatic charge, and more particularly to a device that measures an electrostatic charge and allows for the measurement range to be changed during the measurement process.

BACKGROUND

An electrometer is an electronic circuit designed to measure very small currents ($10^{-16}$ to $10^{-3}$ Ampere). Electrometers are commonly used to measure electrostatic charge on objects using a shielded sensing electrode such as a Faraday cup.

FIG. 1 illustrates the basic geometry, prior to taking a measurement, for measuring electrostatic charge with an electrometer 30 and a Faraday cup 32. The Faraday cup 32 is an apparatus with two electrodes designed to measure charge. The outer electrode 34 is a grounded electrode that electrically shields the inner sensing electrode 36. The sensing electrode 36 is preferably connected to an input terminal of the electrometer 30 using a shielded cable 38. The electrometer 30 has a high gain differential amplifier 40 with an integrating capacitor $C_{int}$ connected between the output terminal $V_{OUT}$ and the negative input terminal. Prior to making a charge measurement, a "zero reset switch" 42 must be momentarily closed to insure that charge on $C_{int}$ is zero. The high gain differential amplifier 40 maintains its two input terminals at the same voltage. The positive input terminal is connected to ground, so the negative input terminal is maintained at zero volts. Prior to taking a measurement, $V_{OUT}$ is zero because the negative input terminal is at ground potential and the voltage across $C_{int}$ is zero.

FIG. 2 illustrates the electrometer 30 being used to measure the charge $Q_X$ of an object 44 which has been placed in the Faraday cup 32. The charge $Q_X$ induces an equal and opposite charge $Q_I$ on the inner sensing electrode 36. This charge is drawn from the integrating capacitor $C_{int}$. The high gain differential amplifier 40 produces an output voltage $V_{OUT}$ proportional to $Q_X$, thereby accomplishing the measurement. The constant of proportionality or scale factor for the charge measurement is determined by the value of $C_{int}$, and $Q_X$ may be determined as follows:

$$Q_X = -V_{OUT} \cdot C_{int}$$

Unfortunately, one difficulty with the measurement illustrated in FIG. 2 is that the high gain differential amplifier 40 has a fixed range of output voltages that is typically ±10 Volts. If $C_{int}$ is too small, $V_{OUT}$ will exceed 10 Volts and the amplifier will saturate. With saturation, the measurement of $Q_X$ is lost. To deal with this problem, commercially available electrometers commonly have several different integrating capacitors as illustrated in the electrometer 46 of FIG. 3. One of the capacitors $C_{int,1}$, $C_{int,2}$, $C_{int,3}$, $C_{int,4}$, $C_{int,5}$ is selected by a front panel switch 48 prior to making a measurement. Unfortunately, many commercially available electrometers operate in a manner that does not allow the device's measurement range to be changed once the measurement cycle has been commenced.

Since the measurement range of an electrometer being used to measure electrostatic charge is determined by the integrating capacitor that must be selected prior to a measurement, the range cannot be changed during the measurement because the charge on the integrating capacitor would have to transfer to the newly selected integrating capacitor without loss of charge. If the range selected is too sensitive, that is, the integrating capacitor selected is too small, the output of the high gain differential amplifier 40 will saturate and information on the charge being measured will be lost. If the measurement range selected is too big, that is, the integrating capacitor selected is too big, the instrument will lack the sensitivity to provide a useful reading. For example, assume that an operator selects a very big measurement range, $10^{-3}$ Coulombs/volt, utilizing a very large 1 mF capacitor. If the charge to be measured is 1 nC, the resulting output voltage will be only 0.000001 V. The high gain differential amplifier 40 would have to be very sensitive and the factor used to scale the voltage to determine the charge would have to be accurate to 6 significant figures. Calibration of sensitive equipment is, at best, 0.1% or 4 significant digits, which is a factor of 100× less than required.

Furthermore, electrometers used to measure charge need to be reset prior to making a measurement to insure that the charge stored on the integrating capacitor is zero. The time needed to discharge the integrating capacitor often exceeds 100 mS which is too long for many applications. Faster discharge times are desirable.

Furthermore, the components used in electrometers, such as the high gain differential amplifiers, may be susceptible to damage from electrostatic discharge (ESD) events or sparks. It would also be desirable to have an electrometer which was less susceptible to ESD damage.

Therefore, there is an need for a more versatile and efficient electrometer. In particular, it would be desirable to have an electrometer for use in electrostatic charge measurement which is capable of range adjustment during measurement, is simple and relatively inexpensive to manufacture, and which preferably has a shortened zero reset time and protection against electrostatic discharge.

SUMMARY

An electrometer is disclosed. The electrometer has a high gain differential amplifier having a first input, a second input, and an output. The electrometer also has feedback switching circuitry. The electrometer further has a plurality of feedback elements configured to be selectively and cumulatively added in any parallel combination between the output and the first input of the high gain differential amplifier via the feedback switching circuitry.

A method of adjusting a measurement range of an electrometer while the electrometer is being used to measure an electrostatic charge is also disclosed. One or more additional feedback elements are selectively added in parallel with one or more existing feedback elements which are coupled between an output and an input of a high gain differential amplifier of the electrometer.

Another electrometer is also disclosed. The electrometer has a) a high gain differential amplifier having a first input, a second input, and an output. The electrometer also has b) a sensing electrode coupled to the first input of the high gain differential amplifier. The electrometer further has c) a level detector circuit configured to monitor the output of the high gain differential amplifier. The electrometer also has d) a plurality of integrating capacitors; and e) one or more feedback switches. The plurality of integrating capacitors are coupled in parallel circuit paths between the first input and the output of the high gain differential amplifier. Each of the one or more feedback switches is coupled in series with at least one of the plurality of integrating capacitors. The electrometer also has f) control circuitry coupled to the level detector circuit and the one or more feedback switches, such that the control circuitry adds one or more of the plurality of integrating capacitors in parallel combination between the output and the first input of the high gain differential amplifier by completing one or more of the parallel circuit paths via the one or more feedback switches depending on an output of the level detector circuit. A charge measured by the electrometer is proportional to a voltage of the high gain differential amplifier output multiplied by a total feedback capacitance from the plurality of integrating capacitors which have been selectively and cumulatively added in parallel combination between the output and the first input of the high gain differential amplifier via control circuitry and the one or more feedback switches.

Figure 1:
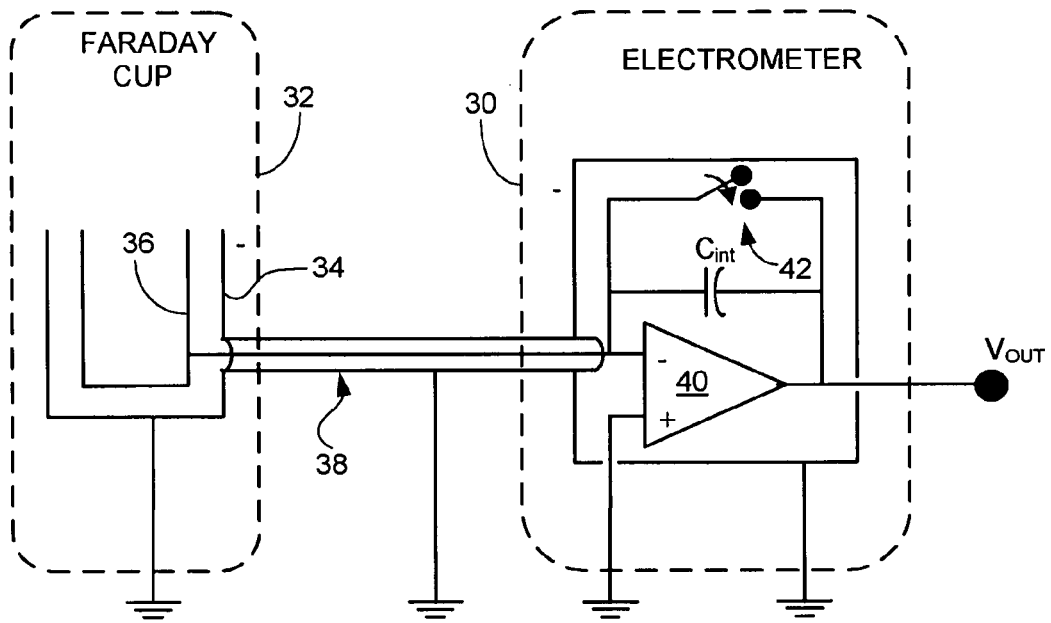
FIGS. 1-3 illustrate a prior art embodiments of an electrometer being used to measure a charge on an object.
Figure 2:
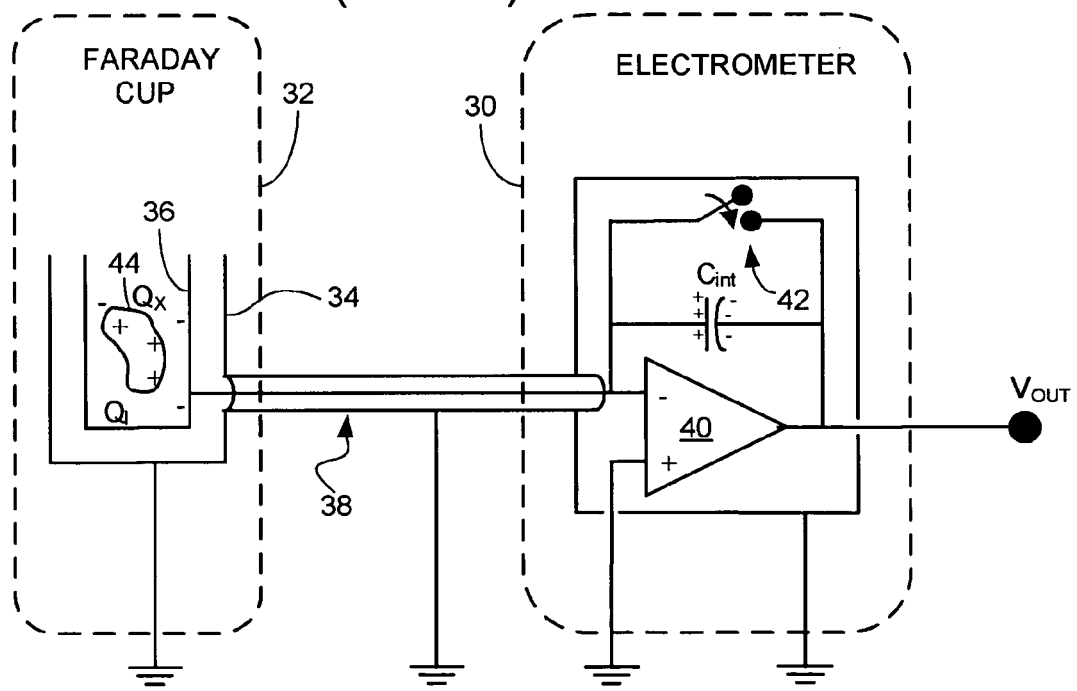
Figure 3:
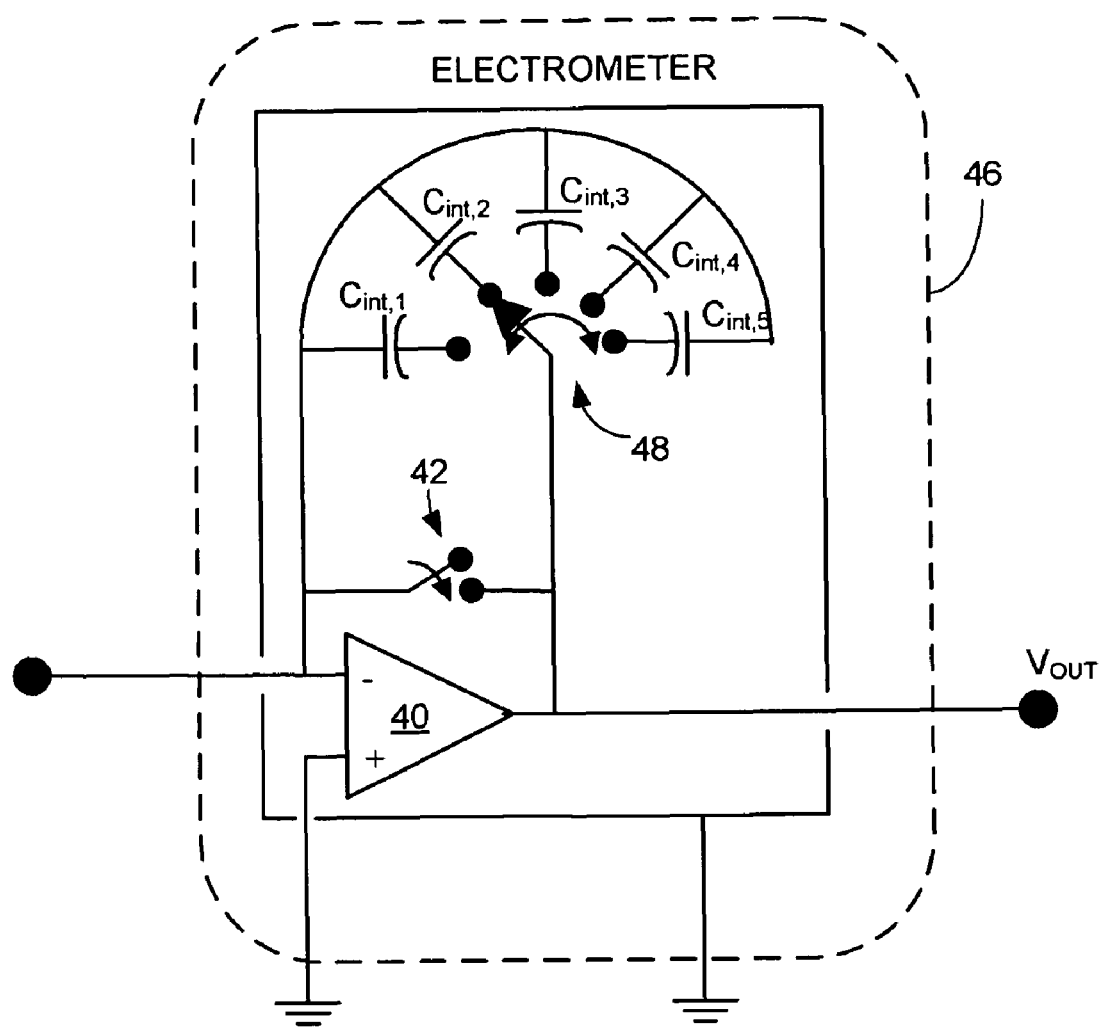

It will be appreciated that for purposes of clarity and where deemed appropriate, reference numerals have been repeated in the figures to indicate corresponding features, and that the various elements in the drawings have not necessarily been drawn to scale in order to better show the features.

DETAILED DESCRIPTION

Figure 4:
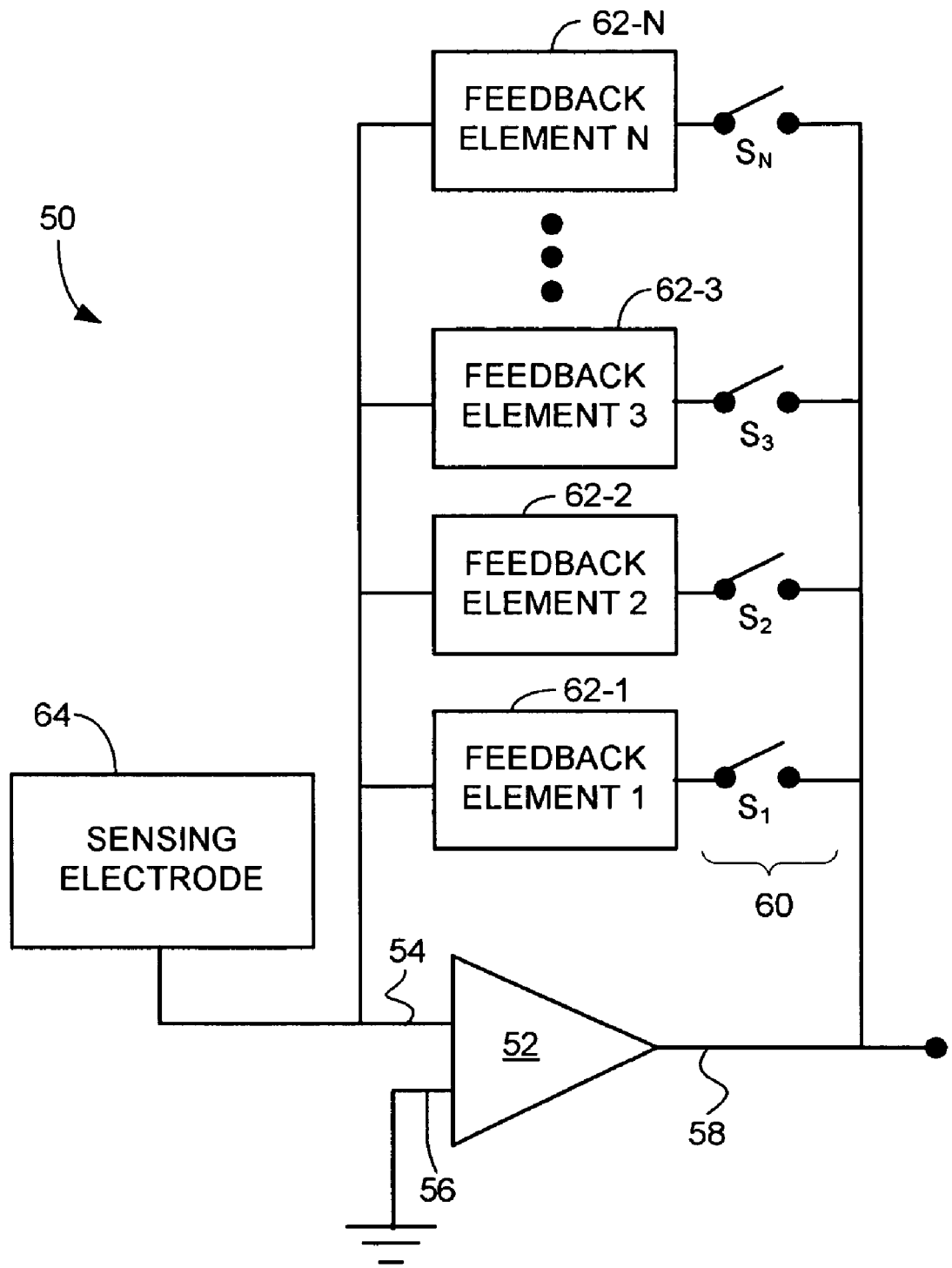
FIG. 4 schematically illustrates one embodiment of an electrometer.

FIG. 4 schematically illustrates one embodiment of an electrometer 50. The electrometer has a high gain differential amplifier 52 having a first input 54, a second input 56, and an output 58. The electrometer 50 also has feedback switching circuitry 60, which in this embodiment includes switches S1, S2, S3, and SN. The electrometer further has a plurality of feedback elements 62-1, 62-2, 62-3, and 62-N configured to be selectively and cumulatively added in any parallel combination between the output 58 and the first input 54 of the high gain differential amplifier 52 via the feedback switching circuitry 60. At least one feedback element 62 will need to be coupled between the output 58 and the first input 54 of the high gain differential amplifier 52 for a charge measurement, so some embodiments may not have a switch in line with one or more of the feedback elements 62. In these embodiments, the extra switch or switches may be avoided by assuming a particular feedback element 62 will always be used for measurements.

The first input 54 may be configured to be coupled to a sensing electrode 64. In other embodiments, the sensing electrode 64 may be integral with the electrometer 50 and therefore already coupled to the electrometer 50. When an electrostatically charged object (not shown) is brought near the sensing electrode 64, it may induce an opposite charge on the sensing electrode 64. The induced charge on the sensing electrode 64 is drawn through the one or more feedback elements 62 which are added in parallel combination between the output 58 and the first input 54 of the high gain differential amplifier 52 by the feedback switching circuitry 60. Examples of this operation will be discussed in more detail in later embodiments.

Figure 5:
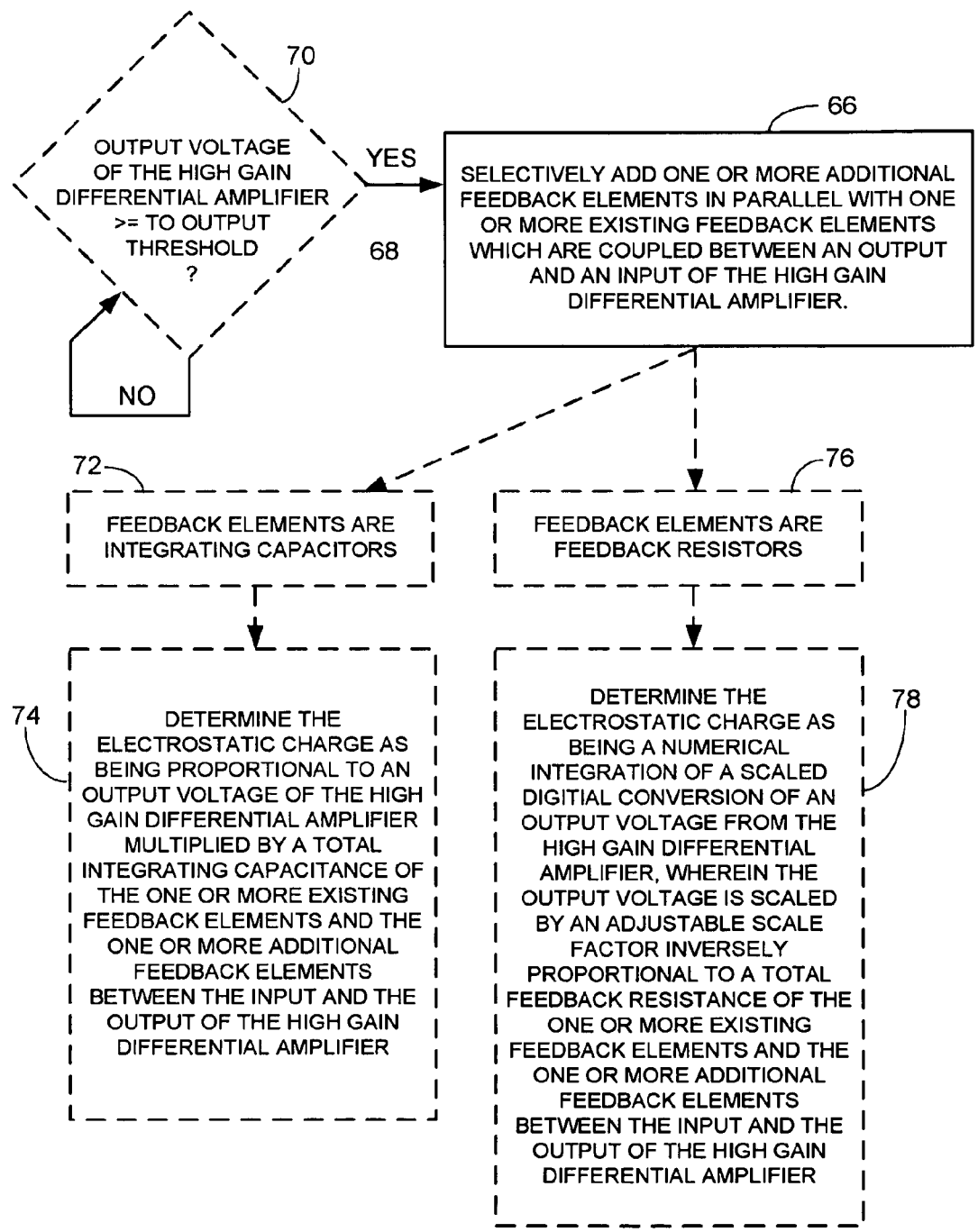
FIG. 5 illustrates one embodiment of a method of adjusting a measurement range of an electrometer while the electrometer is being used to measure an electrostatic charge.

The embodied electrometer of FIG. 4 makes it possible to adjust a measurement range of an electrometer while the electrometer is being used to measure an electrostatic charge. Accordingly, FIG. 5 illustrates one embodiment of a method of adjusting a measurement range of an electrometer while the electrometer is being used to measure an electrostatic charge. One or more additional feedback elements may be selectively added 66 in parallel with one or more existing feedback elements which are coupled between an output and an input of a high gain differential amplifier. By selectively adding 66 the one or more additional feedback elements, the output voltage of the high gain differential amplifier may be adjusted so that it does not saturate. This selective adding 66 action may be done manually or automatically as will be illustrated in further embodiments, and the action may be triggered by a positive answer 68 to an inquiry 70 as to whether the output voltage of the high gain differential amplifier is greater than or equal to an output threshold. For example, if the output range of the differential amplifier is ±10 Volts, then the output threshold could be set to 90% of the output range. When the output voltage exceeds or equals the output threshold, then one or more additional feedback elements may be manually or automatically added 66 in parallel as described.

Depending on the type of electrometer being used, the feedback elements may be integrating capacitors or feedback resistors. If the feedback elements are integrating capacitors 72, then a measured electrostatic charge may be determined 74 as being proportional to an output voltage of the high gain differential amplifier multiplied by a total integrating capacitance of the one or more existing feedback elements and the one or more additional feedback elements between the input and the output of the high gain differential amplifier. If the feedback elements are feedback resistors 76, then a measure electrostatic charge may be determined 78 as being a numerical integration of a scaled digital conversion of an output voltage from the high gain differential amplifier, wherein the output voltage is scaled by an adjustable scale factor inversely proportional to a total feedback resistance of the one or more existing feedback elements and the one or more additional feedback elements between the input and the output of the high gain differential amplifier.

Figure 6:
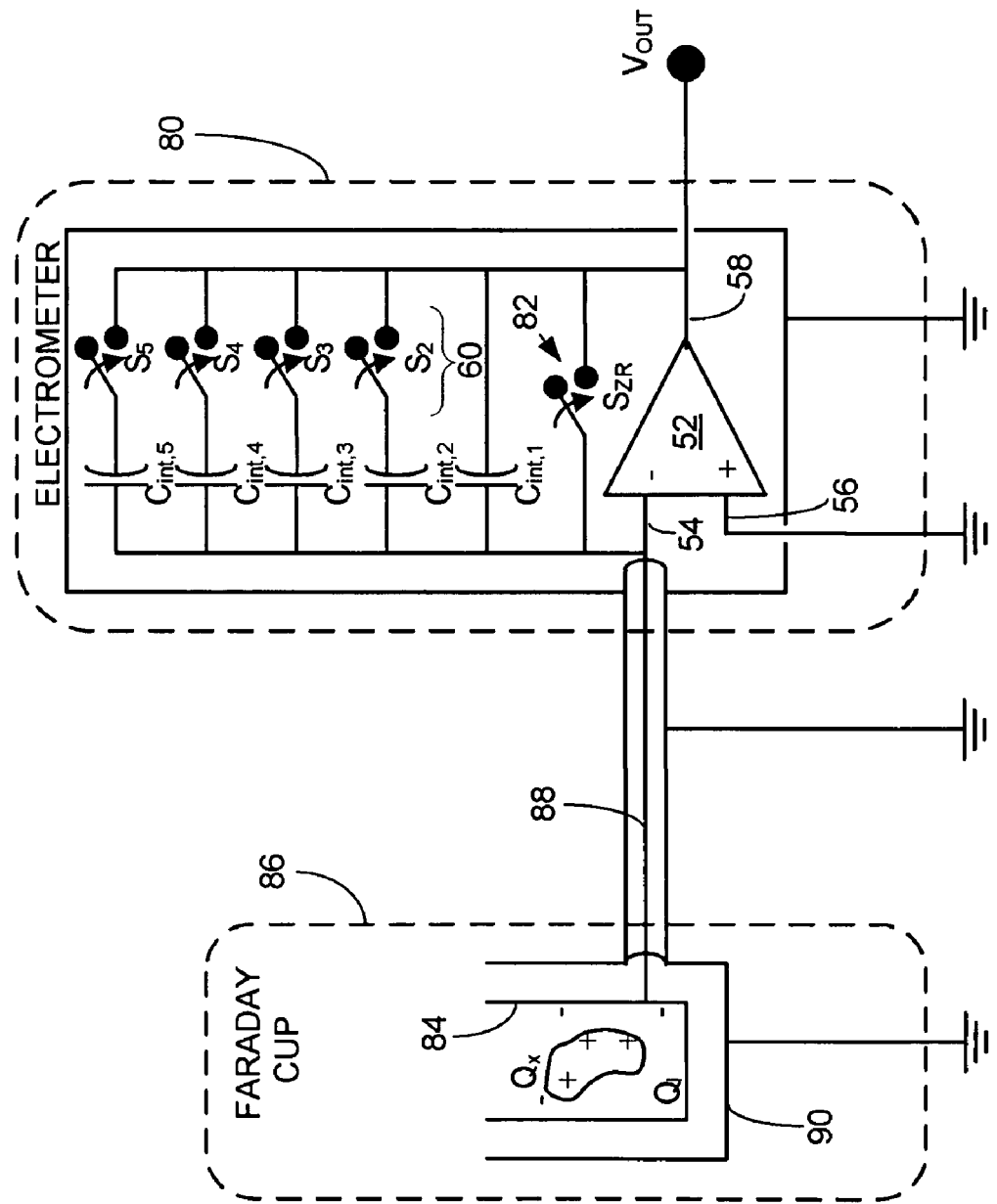
FIG. 6 schematically illustrates another embodiment of an electrometer.

FIG. 6 schematically illustrates another embodiment of an electrometer 80. The electrometer has a high gain differential amplifier 52, having a first input 54, a second input 56, and an output 58. A plurality of integrating capacitors $C_{int,1}$-$C_{int,5}$ are selectably positioned in parallel between the output 58 and the first input 54 of the high gain differential amplifier 52. Cint1 is permanently fixed in parallel between the output 58 and the first input 54, while the remaining capacitors may be added as desired by the feedback switching circuitry 60 which comprises switches $S_2$-$S_5$ in this example. For an electrometer 80 having one or more integrating capacitors, it is important that there be substantially no charge on the capacitors prior to a charge measurement. In order to accomplish this, a "zero reset" 82 is provided in order to selectably short the integrating capacitors when desired.

A sensing electrode 84 is provided as part of a Faraday cup 86 and is coupled to the first input 54 of the high gain differential amplifier 52 by a shielded cable 88. The Faraday cup 86 provides an outer shielding electrode 90 to further isolate the sensing electrode 84.

Prior to making a measurement, switches 82, S2, S3, S4, and S5 are all closed for the zero reset. To initiate the measurement, all switches are opened. As the object with static charge $Q_X$ is placed within the Faraday cup 86, the output voltage $V_{OUT}$ of the high gain differential amplifier 52 increases as charge accumulates on $C_{int,1}$. If the output voltage approaches the maximum output voltage of the amplifier, $S_2$ is closed to add capacitance and lower the voltage. Switches $S_2$, $S_3$, $S_4$, and $S_5$ are closed in sequence to maintain the output voltage within the operating range of the high gain differential amplifier.

FIG. 6 illustrates a circuit where the measurement range of the electrometer 80 can be changed during the measurement without compromise. When all switches are open, the instrument has the most sensitive range. For example, assume that $C_{int,1}$ is 1 pF and that the high gain differential amplifier has an operating range of ±10V. The output voltage is given in (1).

$$V_{OUT} = -\frac{Q_X}{C_{int,1}} = -(1 \text{ V})\left(\frac{Q_X}{1 \text{ pC}}\right) \qquad (1)$$

If $Q_X$ exceeds 10 pC, the output voltage will exceed 10 V and the output voltage of the differential amplifier will saturate. When $V_{OUT}$ exceeds a threshold voltage, say 9V, switch $S_2$ is closed adding capacitor $C_{int,2}$ to the circuit. Assume that $C_{int,2}$ is 9 pF. With $S_2$ closed, the output voltage is now given by (2).

$$V_{OUT} = -\frac{Q_X}{(C_{int,1} + C_{int,2})} = -(1 \text{ V})\left(\frac{Q_X}{10 \text{ pC}}\right) \qquad (2)$$

When switch $S_2$ is closed, the output voltage $V_{OUT}$ of the high gain differential amplifier 52 decreases by 10× enabling the electrometer to accurately measure charges up to 100 pC. In fact, using the $C_{int}$ values given in Table 1, the output voltage of the differential amplifier is given in (3).

TABLE 1

Integrating Capacitor Values

| Capacitor | Value |
| --- | --- |
| $C_{int,1}$ | 1 pF |
| $C_{int,2}$ | 9 pF |
| $C_{int,3}$ | 90 pF |
| $C_{int,4}$ | 900 pF |
| $C_{int,5}$ | 9 nF |

$$V_{OUT} = \begin{cases} -\frac{Q_X}{C_{int,1}} \\ -\frac{Q_X}{(C_{int,1}+C_{int,2})} \\ -\frac{Q_X}{(C_{int,1}+C_{int,2}+C_{int,3})} \\ -\frac{Q_X}{(C_{int,1}+C_{int,2}+C_{int,3}+C_{int,4})} \\ -\frac{Q_X}{(C_{int,1}+C_{int,2}+C_{int,3}+C_{int,4}+C_{int,5})} \end{cases} \qquad (3)$$

$$= \begin{cases} -\left(1\frac{V}{10^{-12}C}\right)Q_X; S_2 \text{ to } S_5 \text{ all open} \\ -\left(1\frac{V}{10^{-11}C}\right)Q_X; \text{only } S_2 \text{ closed} \\ -\left(1\frac{V}{10^{-10}C}\right)Q_X; S_2 \& S_3 \text{ closed} \\ -\left(1\frac{V}{10^{-9}C}\right)Q_X; S_2 \text{ to } S_4 \text{ closed} \\ -\left(1\frac{V}{10^{-8}C}\right)Q_X; S_2 \text{ to } S_5 \text{ closed} \end{cases}$$

The electrometer illustrated in FIG. 6 is able to accurately measure electrostatic charge on objects over a dynamic range of 6 decades of charge from $10^{-13}$ C ($V_{OUT}$=0.1V, all switches open) to $10^{-7}$ C ($V_{OUT}$=10V, all switches closed). The dynamic range can be extended. Each additional decade in measurement range requires an additional integrating capacitor and switch.

Figure 7:
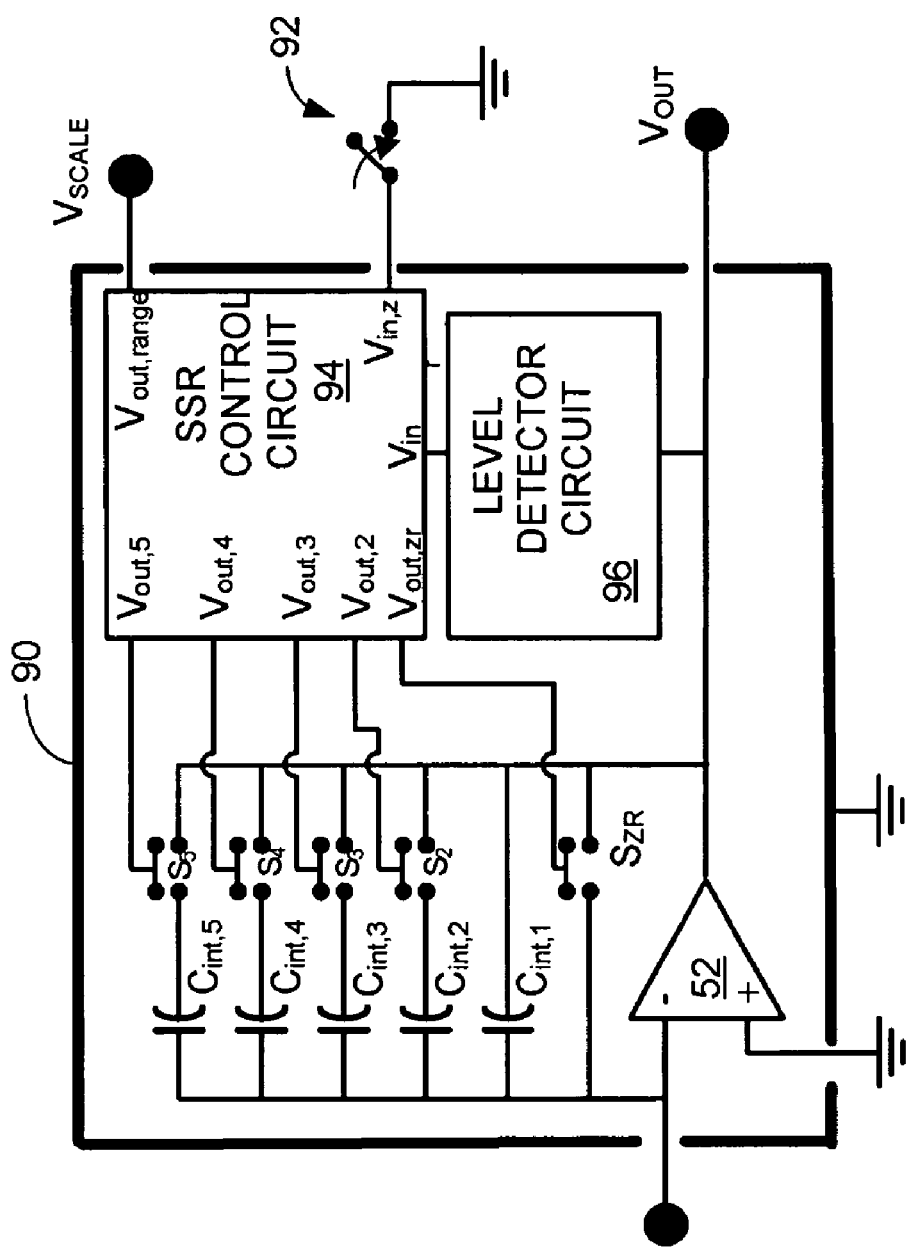
FIG. 7 schematically illustrates a further embodiment of an electrometer.

FIG. 7 schematically illustrates a further embodiment of an electrometer 90 having auto-ranging capability and also using integrating capacitors $C_{int,1}$-$C_{int,5}$. To initiate a measurement, the Zero Reset 92 is momentarily closed. The Solid State Relay Control Circuit (SSR-CC) 94 detects this switch closure and momentarily closes switches $S_{ZR}$, $S_2$, $S_3$, $S_4$, and $S_5$ and subsequently opens them. During operation, the Level Detector Circuit (LDC) 96 monitors the output voltage $V_{OUT}$ of the high gain differential amplifier 52. When $V_{OUT}$ exceeds a predetermined maximum voltage (or threshold), the LDC 96 generates an output signal that is monitored by the SSR-CC 94. The SSR-CC 94 closes switches $S_2$, $S_3$, $S_4$, and $S_5$ in sequence to maintain $V_{OUT}$ below the predetermined maximum voltage. The SSR-CC generates an output $V_{scale}$ to indicate which switches have been closed so that the measured charge can be determined from $V_{OUT}$. Vscale can be either an analog or a digital signal. The measured charge $Q_X$ may be determined as follows:

$$Q_X = -V_{OUT} \cdot C_{int,total} \quad (4)$$

where Cint,total is the total capacitance which has been added in parallel between the input and the output of the high gain differential amplifier as indicated by $V_{scale}$.

Figure 8A:
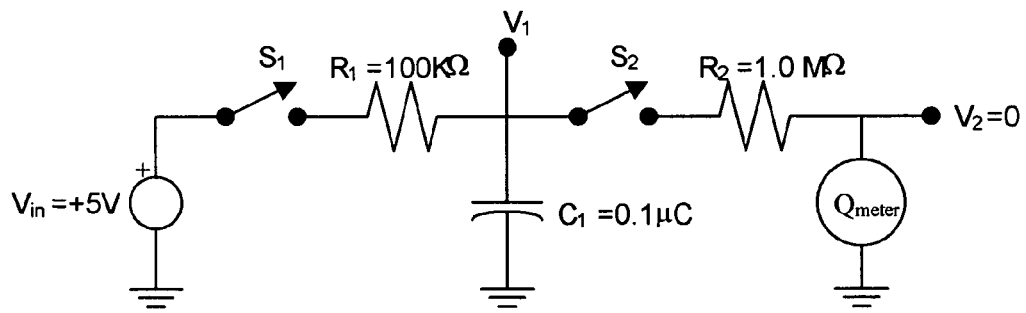
FIG. 8A schematically illustrates a circuit for capacitor calibration as part of an experiment to demonstrate the feasibility of a charge measuring auto-ranging technique.
Figure 8B:
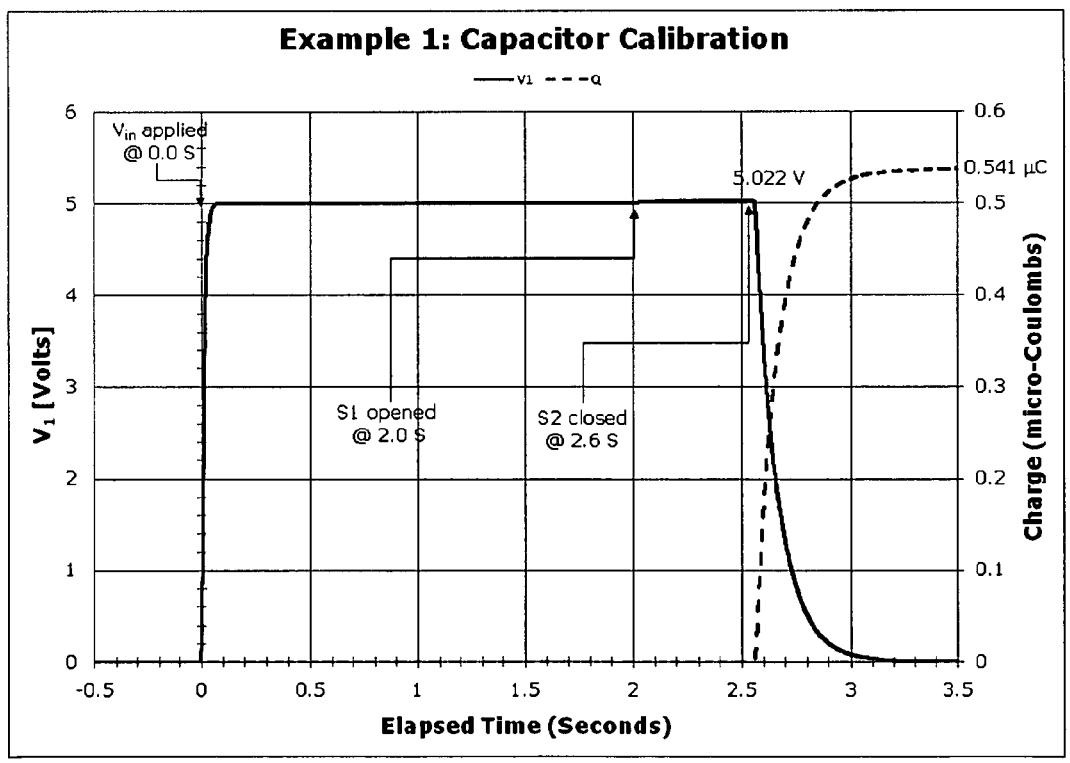
FIG. 8B illustrates test results from operating the circuit of FIG. 8A during an experiment.

FIG. 8A schematically illustrates a circuit for capacitor calibration as part of an experiment to demonstrate the feasibility of a charge measuring auto-ranging technique. Calibration is accomplished using a 2-step process. First, capacitor $C_1$ is charged through $R_1$ to voltage $V_{in}$. Next, capacitor $C_1$ is discharged through $R_2$ to measure charge Q using meter $Q_{meter}$. The charge meter $Q_{meter}$ is a commercially available Keithley Model 6517A System Electrometer with a current calibration certificate (dated within the last 12 months) from the manufacturer (see Appendix 1). Table 2 summarizes the calibration sequence. The waveforms recorded during the calibration are shown in FIG. 8B. Note that in Sequence Step 10, voltage $V_1$ increases measurably from +5.0 volts to +5.022 volts. This increase in voltage is caused by a small off-set current in the input amplifier of the data acquisition system. This increase of 0.022 volts does not alter significantly the operation of the circuit.

The computed value of capacitor C1 is given in (5).

$$C_1 = \frac{Q}{V} = \frac{0.541\ \mu C}{5.022\ V} = 0.108\ \mu F \quad (5)$$

Figure 9A:
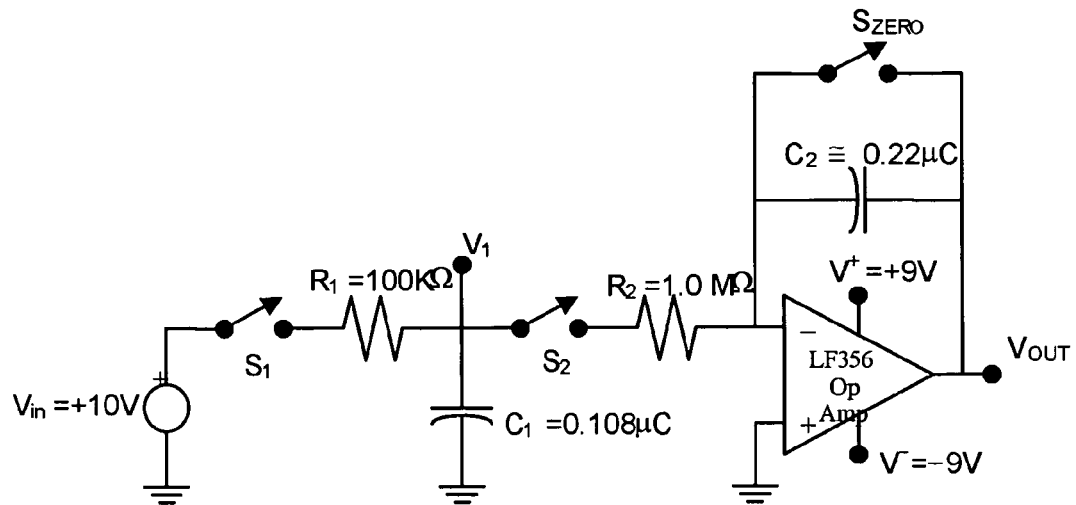
FIG. 9A schematically illustrates a circuit for charge measurement as part of an experiment to demonstrate the feasibility of a charge measuring auto-ranging technique.

FIG. 9A schematically illustrates a circuit for charge measurement as part of an experiment to demonstrate the feasibility of a charge measuring auto-ranging technique. An LF356 Operational Amplifier and integrating capacitor $C_2$ measure the charge stored on capacitor $C_1$. The output voltage $V_{OUT}$ is related to the measured charge Q by the fixed value of integrating capacitor $C_2$. The discharge current from capacitor $C_1$ is integrated by capacitor $C_2$ to measure the charge. Note that the range of the output voltage $V_{OUT}$ is determined by the voltages powering the Operational Amplifier V+ and V−. The range of charge that can be measured using this circuit is determined by the value of the integrating capacitor $C_2$ and the voltage range of the Op Amp as in (6) through (9).

$$Q_{MIN} < Q_{MEASURED} < Q_{MAX} \quad (6)$$

$$C_2 V^- < Q_{MEASURED} < C_2 V^+ \quad (7)$$

$$(0.22\ \mu F)(-9\ V) < Q_{MEASURED} < (0.22\ \mu F)(+9\ V) \quad (8)$$

$$-2.0\ \mu C < Q_{MEASURED} < +2.0\ \mu C \quad (9)$$

Figure 9B:
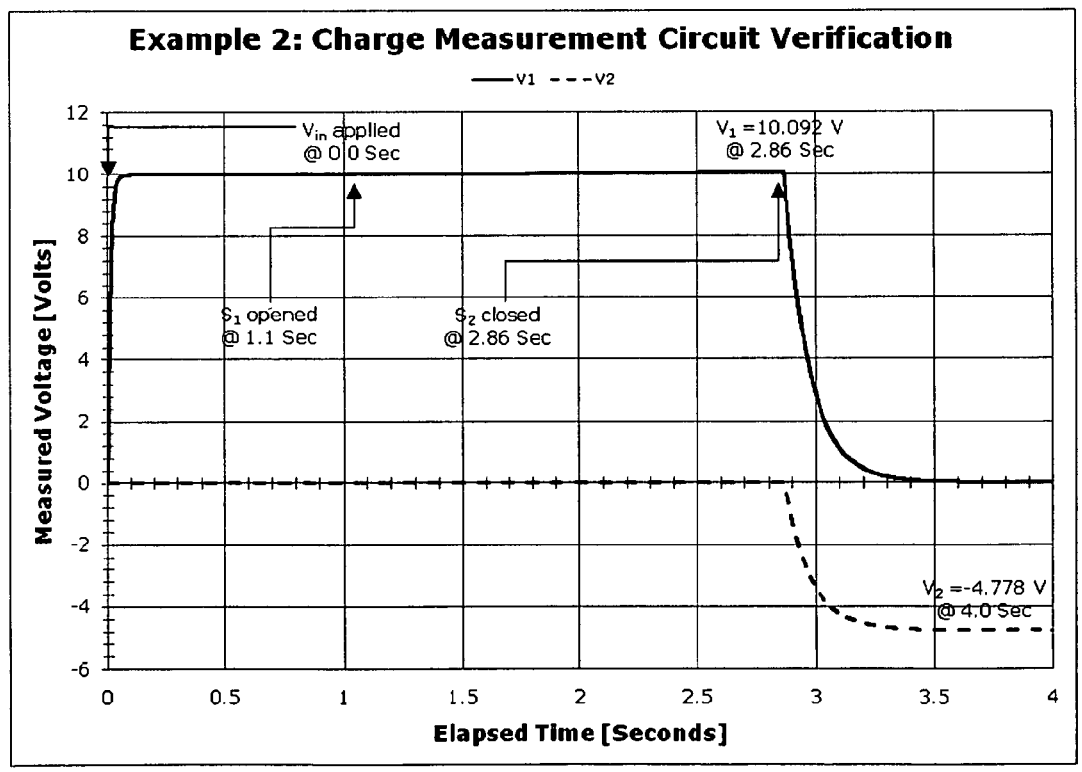
FIG. 9B illustrates test results from operating the circuit of FIG. 9A during an experiment.

The sequence for using the circuit in FIG. 9A to measure the charge on capacitor $C_1$ is summarized in Table 3 and the resulting waveforms are shown in FIG. 9B.

TABLE 2

Capacitor $C_1$ Calibration Sequence

| Operation | Comments |
|---|---|
| Set data acquisition system to monitor $V_1$ and $Q_{meter}$. | The data acquisition system is configured to collect the required data. |
| Close switch $S_1$. | Connect capacitor $C_1$ to power supply $V_{in}$. |
| Open switch $S_2$. | Disconnect $Q_{meter}$ from circuit during the charging cycle. |
| Zero and arm charge meter $Q_{meter}$. | The charge meter must first be manually zeroed and then set to measure charge. |
| Start data acquisition system. | The data acquisition system records the waveforms for later analysis. |
| $V_{in}$ is automatically set to +5.0 volts. | LabVIEW is a computer program that controls the data acquisition system. The system includes an analog output channel that is set to +5.0 volts. |
| Wait at least 0.5 seconds. | As is evident in FIG. 8B, the voltage across capacitor $C_1$ reaches steady state in about 0.1 S. |
| Open switch $S_1$. | Capacitor $C_1$ is disconnected from the power supply. |
| Wait at least 1 second. | As is evident in FIG. 8B, the voltage across capacitor $C_1$ remains essentially constant after being disconnected from the power supply. |
| Close switch $S_2$. | Capacitor $C_1$ is connected to the charge meter $Q_{meter}$ through resistor $R_2$ to measure the stored charge. |
| Wait at least 2 seconds to finish experiment. | As is evident in FIG. 8B, capacitor $C_1$ fully discharges in about 1 second. |

TABLE 3

Charge Measurement Sequence

| Step | Operation | Comments |
|---|---|---|
| 1. | Set data acquisition system to monitor $V_1$ and $V_{OUT}$. | The data acquisition system is configured to collect the required data. |
| 2. | Close switch $S_1$. | Connect capacitor $C_1$ to power supply $V_{in}$. |
| 3. | Open switch $S_2$. | Disconnect $Q_{meter}$ from circuit during the charging cycle. |
| 4. | Close switch $S_{ZERO}$ for 1 second to fully discharge capacitor $C_2$. | The integrating capacitor $C_2$ must be fully discharged to zero the charge measurement circuit. |
| 5. | Open switch $S_{ZERO}$. | Switch $S_{ZERO}$ must be open to measure charge. |
| 6. | Start data acquisition system. | The data acquisition system records the waveforms for later analysis. |
| 7. | $V_{in}$ is automatically set to +10.0 volts. | LabVIEW is a computer program that controls the data acquisition system. The system includes an analog output channel that is set to +10.0 volts. |
| 8. | Wait at least 0.5 seconds. | As is evident in FIG. 9B, the voltage across capacitor $C_1$ reaches steady state in about 0.1 S. |
| 9. | Open switch $S_1$. | Capacitor $C_1$ is disconnected from the power supply. |
| 10. | Wait at least 1 second. | As is evident in FIG. 9B, the voltage across capacitor $C_1$ remains constant after being disconnected from the power supply. |
| 11. | Close switch $S_2$. | Capacitor $C_1$ is connected to LF356 Op Amp through resistor $R_2$ to measure the stored charge. |
| 12. | Wait at least 2 seconds to finish experiment. | As is evident in FIG. 9B, capacitor $C_1$ fully discharges in about 1 second. |

Note that in Sequence Step 10, voltage $V_1$ increases measurably from +10.0 volts to +10.092 volts. This increase in voltage is caused by a small off-set current in the input amplifier of the data acquisition system. This increase of 0.092 volts does not alter significantly the operation of the circuit.

The value of integrating capacitor $C_2$ is determined by equating the measured charge $Q_{MEASURED}$ to the charge stored on capacitor $C_1$ as shown in (10)-(12):

$$Q_{MEASURED} = Q_{C1} \tag{10}$$

$$-C_2 V_{OUT} = C_1 V_1 \tag{11}$$

$$C_2 = -\frac{C_1 V_1}{V_{OUT}} = -\frac{(0.108\ \mu F)(+10.092\ V)}{(-4.778\ V)} = 0.228\ \mu F \tag{12}$$

Figure 10A:
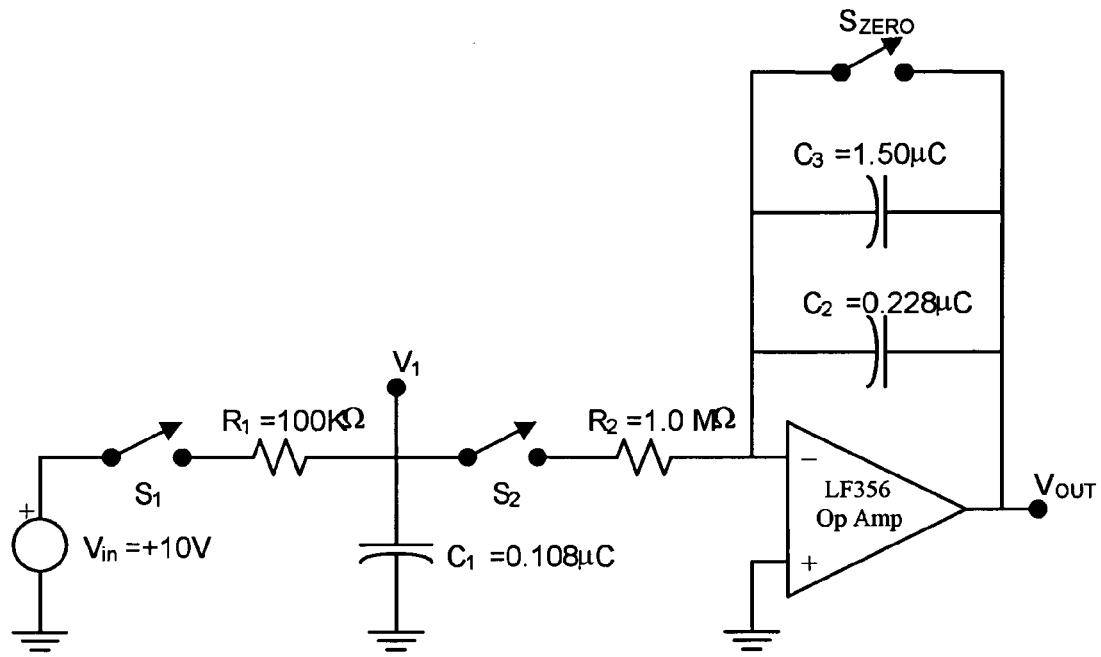
FIG. 10A schematically illustrates a circuit for extending measurement range as part of an experiment to demonstrate the feasibility of a charge measuring auto-ranging technique.

FIG. 10A schematically illustrates a circuit for extending measurement range as part of an experiment to demonstrate the feasibility of a charge measuring auto-ranging technique. The measurement range of the charge measuring circuit is extended by adding a second integrating capacitor $C_3$ in parallel with the first integrating capacitor $C_2$. The value of the integrating capacitance is increased by adding a second capacitor $C_3$ in parallel with original integrating capacitor $C_2$. With two in integrating capacitors, the total integrating capacitance is the sum of the two capacitors at in (13).

$$C_{INTEGRATING} = C_2 + C_3 = 0.228\ \mu F + 1.5\ \mu F = 1.7\ \mu F \tag{13}$$

The range of charge that can be measured using this circuit is determined by the value of the integrating capacitance $C_{INTEGRATING}$ and the voltage range of the Op Amp as in (14) through (17).

$$Q_{MIN} < Q_{MEASURED} < Q_{MAX} \tag{14}$$

$$C_{INTEGRATING} V^- < Q_{MEASURED} < C_{INTEGRATING} V^+ \tag{15}$$

$$(1.7\ \mu F)(-9\ V) < Q_{MEASURED} < (1.7\ \mu F)(+9\ V) \tag{16}$$

$$-15\ \mu C < Q_{MEASURED} < +15\ \mu C \tag{17}$$

Figure 10B:
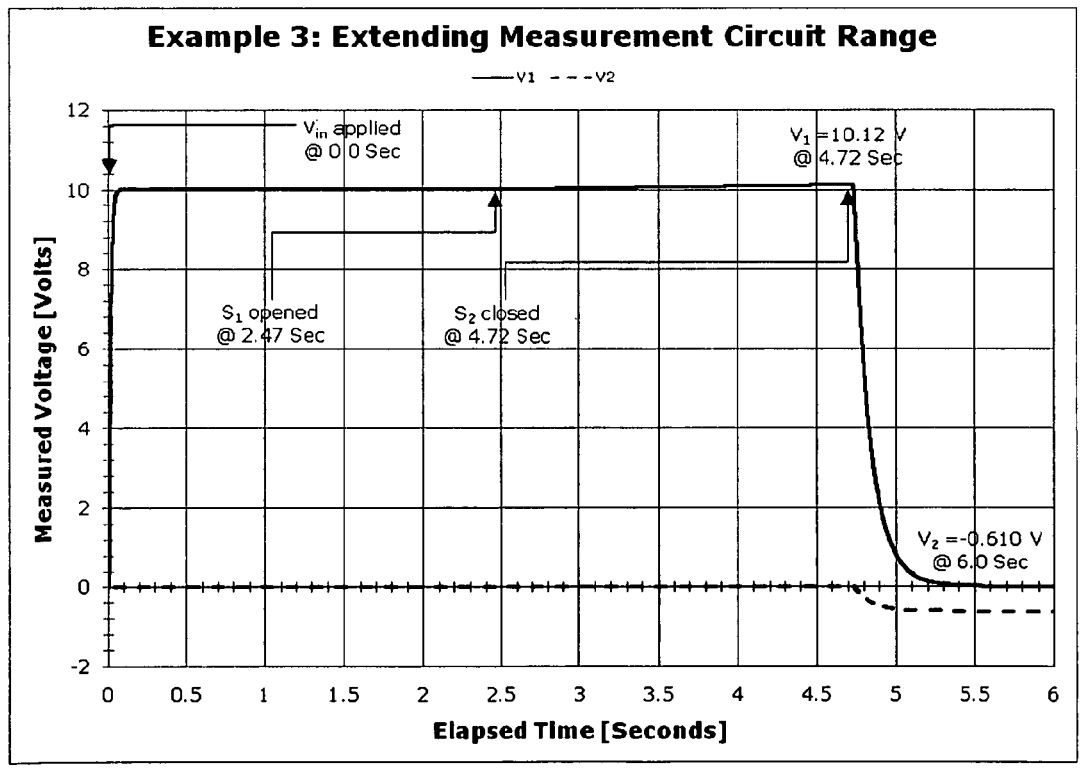
FIG. 10B illustrates test results from operating the circuit of FIG. 10A during an experiment.

Note that the measurement range of the circuit is extended from ±2.0 µC to ±15 µC. The sequence for using the circuit in FIG. 10A to measure the charge on capacitor $C_1$ is unchanged and summarized in Table 3. The resulting waveforms are shown in FIG. 10B.

Note that in Sequence Step 10, voltage $V_1$ increases measurably from +10.0 volts to +10.12 volts. This increase in voltage is caused by a small off-set current in the input amplifier of the data acquisition system. This increase of 0.12 volts does not alter significantly the operation of the circuit.

The value of integrating capacitor $C_2$ is determined by equating the measured charge $Q_{MEASURED}$ to the charge stored on capacitor C1 as in (10) through (12).

$$Q_{MEASURED} = Q_{C1} \tag{18}$$

$$-C_{INTEGRATING} V_{OUT} = -(C_2 + C_3) V_{OUT} = C_1 V_1 \tag{19}$$

$$C_3 = -\frac{C_1 V_1}{V_{OUT}} - C_2 = -\frac{(0.108\ \mu F)(+10.12\ V)}{(-0.610\ V)} - 0.228\ \mu F \tag{20}$$
$$= 1.792\ \mu F - 0.228\ \mu F = 1.564\ \mu F$$

Figure 11A:
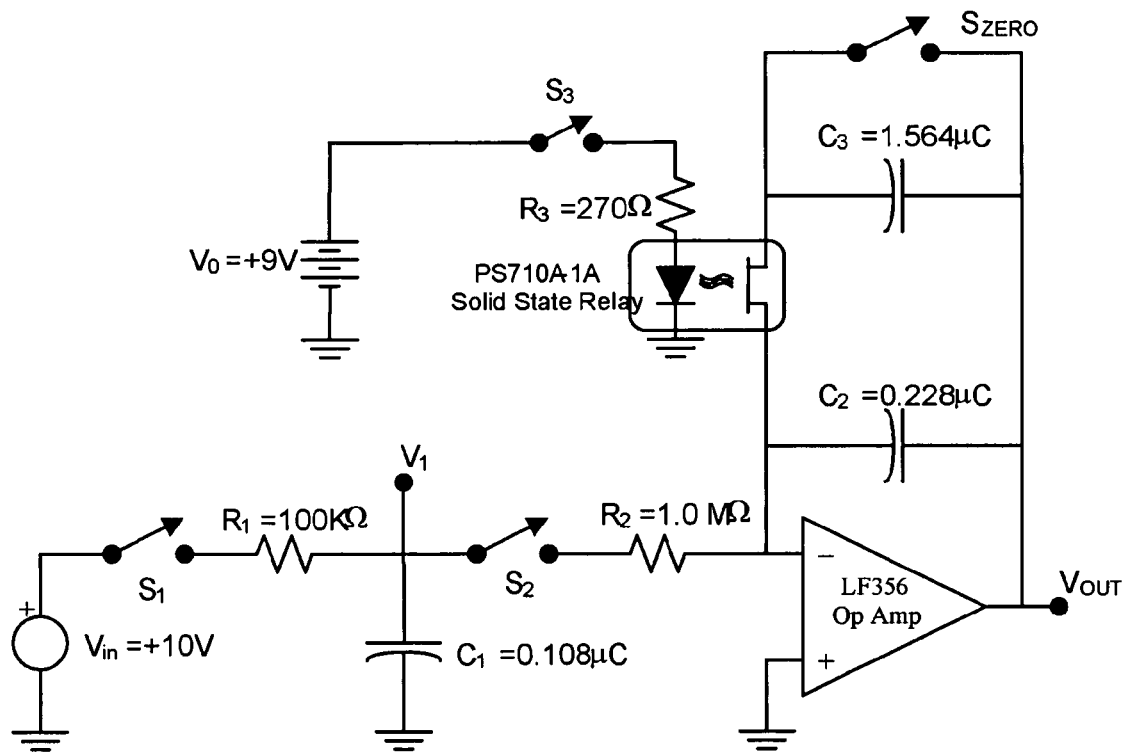
FIG. 11A schematically illustrates a circuit for auto-ranging charge measurement as part of an experiment to demonstrate the feasibility of a charge measuring auto-ranging technique.

FIG. 11A schematically illustrates a circuit for auto-ranging charge measurement as part of an experiment to demonstrate the feasibility of a charge measuring auto-ranging technique. Extending the measurement range of the charge measuring circuit is automated by using a solid state relay to add an additional integrating capacitor $C_3$. A PS710A-1A solid state relay and switch $S_3$ are used to add an additional capacitor $C_3$ in parallel with the existing integrating capacitor $C_2$. The sequence used to use the solid state relay to extend the measurement range of the circuit is summarized in Table 4.

TABLE 4

Extending Charge Measurement Range Sequence

Figure 11B:
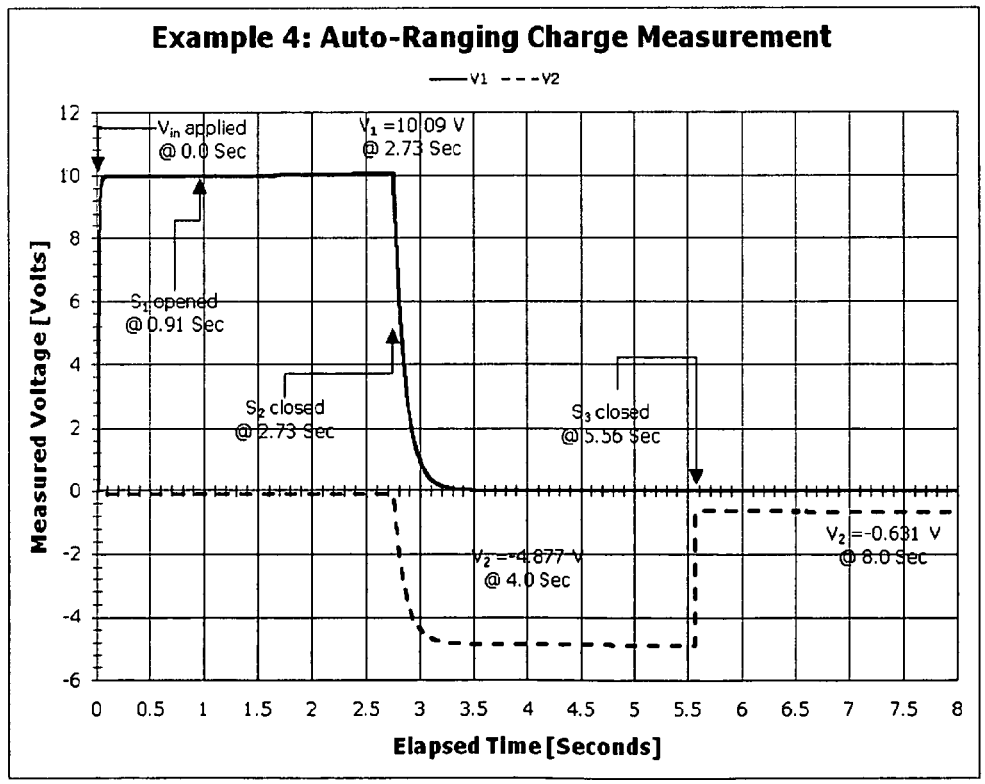
FIG. 11B illustrates test results from operating the circuit of FIG. 11A during an experiment.

| Step | Operation | Comments |
|---|---|---|
| 1. | Set data acquisition system to monitor $V_1$ and $V_{OUT}$. | The data acquisition system is configured to collect the required data. |
| 2. | Close switch $S_1$. | Connect capacitor $C_1$ to power supply $V_{in}$. |
| 3. | Open switch $S_2$. | Disconnect LF356 Op Amp from circuit during the charging cycle. |
| 4. | Close switch $S_3$. | Connect capacitor $C_3$ to the circuit to fully discharge the integrating capacitance. |
| 5. | Close switch $S_{ZERO}$ for 1 second to fully discharge capacitors $C_2$ and $C_3$. | The integrating capacitors $C_2$ and $C_3$ must be fully discharged to zero the charge measurement circuit. |
| 6. | Open switch $S_{ZERO}$. | Switch $S_{ZERO}$ must be open to measure charge. |
| 7. | Open switch $S_3$. | Disconnect integrating capacitor $C_3$ from the circuit. |
| 8. | Start data acquisition system. | The data acquisition system records the waveforms for later analysis. |
| 9. | $V_{in}$ is automatically set to +10.0 volts. | LabVIEW is a computer program that controls the data acquisition system. The system includes an analog output channel that is set to +10.0 volts. |
| 10. | Wait at least 0.5 seconds. | As is evident in FIG. 11B, the voltage across capacitor $C_1$ reaches steady state in about 0.1 S. |
| 11. | Open switch $S_1$. | Capacitor $C_1$ is disconnected from the power supply. |
| 12. | Wait at least 1 second. | As is evident in FIG. 11B, the voltage across capacitor $C_1$ remains constant after being disconnected from the power supply. |
| 13. | Close switch $S_2$. | Capacitor $C_1$ is connected to the charge meter $Q_{meter}$ through resistor $R_2$ to measure the stored charge. |
| 14. | Wait at least 2 seconds. | As is evident in FIG. 11B, capacitor $C_1$ fully discharges in about 1 second. |
| 15. | Close switch $S_3$. | Extend the measurement range of the circuit by adding an additional integrating capacitor. |
| 16. | Wait at least 2 seconds to finish the experiment. | As evident in FIG. 11B, $V_{OUT}$ quickly reaches steady state; in less than 0.01 seconds. |

Note that in Sequence Step 10, voltage $V_1$ increases measurably from +10.0 volts to +10.09 volts. This increase in voltage is caused by a small off-set current in the input amplifier of the data acquisition system. This increase of 0.09 volts does not alter significantly the operation of the circuit.

The measurement range of the circuit is extended during a charge measurement, which demonstrates the feasibility of the auto-ranging method. The charge stored on capacitor $C_1$ is given in (21).

$$Q_1 = C_1 V_1 = (0.108\ \mu F)(10.09\ V) = 1.090\ \mu C \quad (21)$$

The measured charge prior to closing switch $S_3$ is given in (22).

$$Q_{MEASURED} = -C_2 V_{OUT} = (0.228\ \mu F)(-4.877\ V) = 1.112\ \mu C \quad (22)$$

The charge measurement prior to closing switch $S_3$ is repeatable to within 2%. Results from prototype circuits are typical repeatable to with 5%, which is consistent with these results. Repeatability would be much better using a hard wired, dedicated circuit. The measured charge after closing switch $S_3$ is given in (23).

$$Q_{MEASURED} = -(C_2 + C_3)V_{OUT} = (0.228\ \mu F + 1.564\ \mu F)(-0.631\ V) = 1.131\ \mu C \quad (23)$$

The charge measurement after closing switch $S_3$ is repeatable to within 4%, which is consistent with the repeatability of prototype circuits. The use of the PS710A-1A does not significantly degrade the performance of the charge measuring circuit. Measurement repeatability would be much better using a hard wired, dedicated circuit.

Figure 12:
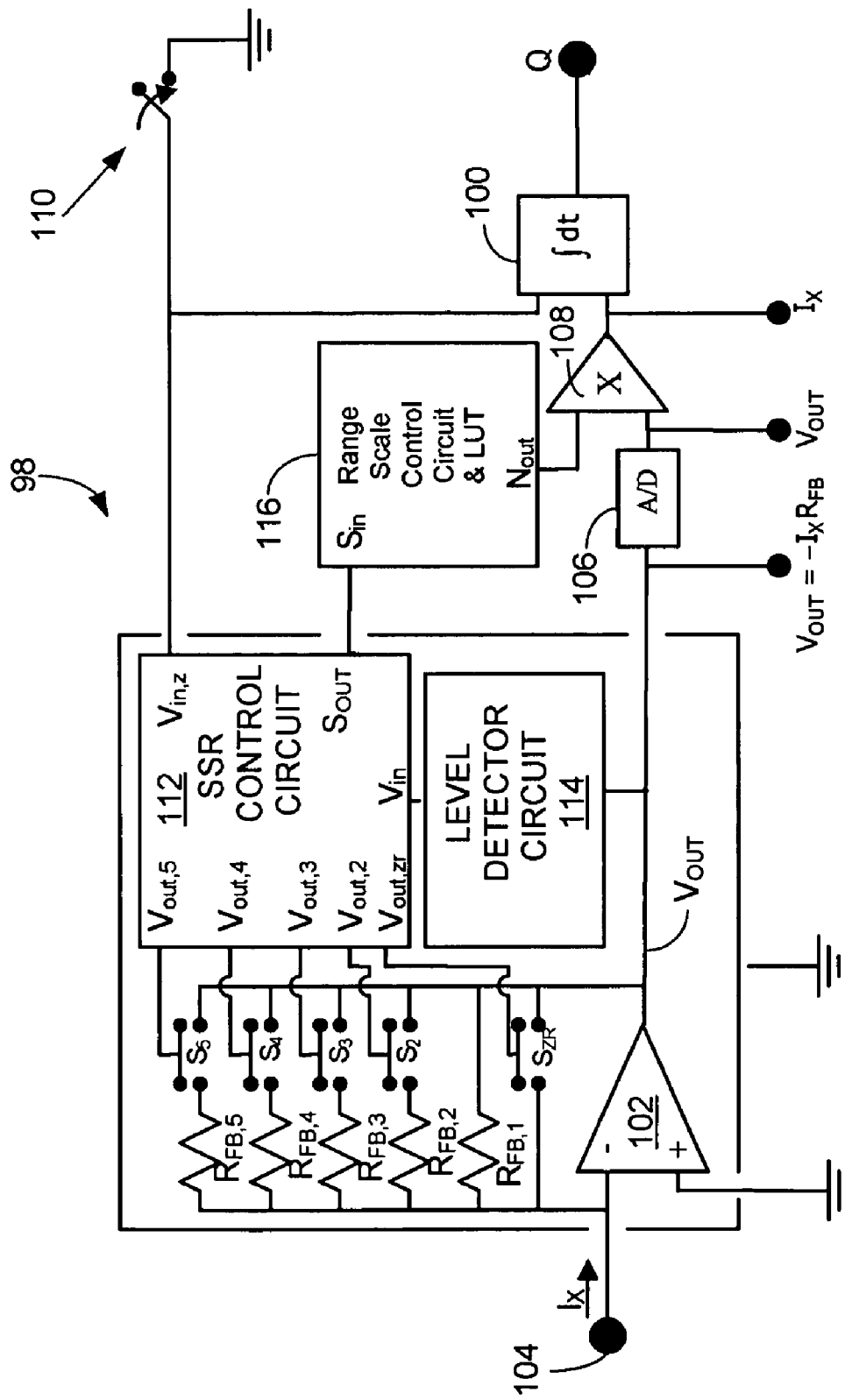
FIGS. 12-13 schematically illustrate further embodiments of an electrometer.

FIG. 12 schematically illustrates an embodiment of an electrometer 98 having a numerical integrator 100. The feedback elements in this embodiment are feedback resistors $R_{FB,1}$-$R_{FB,5}$, which may be selectively added in parallel between the output and the input of the high gain differential amplifier 102. Input current $I_X$ is to be integrated to determine charge $Q_X$. Current $I_X$ flows into the input of the terminal 104 of the electrometer. To initiate a measurement, the Zero Reset Control Switch 110 is momentarily closed resetting the numerical integrator 100 to zero. The Solid State Relay Control Circuit (SSR-CC) 112 detects this switch closure and opens switches $S_2$, $S_3$, $S_4$, and $S_5$. Note that the electrometer can be reset as quickly as the solid state relays can be switched which is typically several milliseconds. This fast reset time is a significant advantage for electrometers used for continuous process control.

During operation, the Level Detector Circuit (LDC) 114 monitors the output voltage $V_{OUT}$ of the high gain differential amplifier 102. When $V_{OUT}$ exceeds a predetermined maximum voltage, the LDC 114 generates an output signal that is monitored by the SSR-CC 112. The SSR-CC 112 closes switches $S_2$, $S_3$, $S_4$, and $S_5$ in sequence to maintain $V_{OUT}$ below the maximum voltage. The SSR-CC 112 generates an output signal $S_{out}$ to indicate which switches have been closed. The Range Scale Control Circuit (RSCC) 116 monitors this signal and selects the correct scale factor from a Look-Up Table (LUT). The RSCC 116 generates output $N_{out}$ so that the correct multiplying factor is used to scale $V_{OUT}$ to determine $I_X$.

The input impedance of the high gain differential amplifier 102 is very high (>$10^{+15}\Omega$) so this current flows through the one or more feedback resistors $R_{FB,1}$-$R_{FB,5}$, depending on which ones have been enabled. The output voltage $V_{OUT}$ of the high gain differential amplifier is given in (24).

$$V_{OUT} = -I_X R_{FB} \quad (24)$$

$V_{OUT}$ is digitized by the analog to digital (A/D) converter 106. The output of the A/D 106 is multiplied by a scale factor 108 as in (26) to determine current $I_X$. As just one example, using the feedback resistor values given in Table 5, the output voltage of the Differential Amplifier 102 is given in (26).

TABLE 5

| Example Feedback Resistor Values | |
|---|---|
| Capacitor | Value |
| $R_{FB,1}$ | $1.0 \times 10^{+12}$ Ω |
| $R_{FB,2}$ | $1.11 \times 10^{+11}$ Ω |
| $R_{FB,3}$ | $1.11 \times 10^{+10}$ Ω |
| $R_{FB,4}$ | $1.11 \times 10^{+9}$ Ω |
| $R_{FB,5}$ | $1.11 \times 10^{+8}$ Ω |

In (26), the notation $(R_1 \| R_2)$ means that the value of resistance is to be computed for resistors $R_1$ and $R_2$ connected in parallel as defined in (25).

$$(R_1 \| R_2) = \frac{R_1 R_2}{R_1 + R_2} \quad (25)$$

$$V_{OUT} = \begin{cases} -R_{FB,1} I_X \\ -(R_{FB,1} \| R_{FB,2}) I_X \\ -(R_{FB,1} \| R_{FB,2} \| R_{FB,3}) I_X \\ -(R_{FB,1} \| R_{FB,2} \| R_{FB,3} \| R_{FB,4}) I_X \\ -(R_{FB,1} \| R_{FB,2} \| R_{FB,3} \| R_{FB,4} \| R_{FB,5}) I_X \end{cases} \quad (26)$$

$$= \begin{cases} -\left(1 \frac{V}{10^{-12} A}\right) I_X; S_2 \text{ to } S_5 \text{ all open} \\ -\left(1 \frac{V}{10^{-11} A}\right) I_X; \text{only } S_2 \text{ closed} \\ -\left(1 \frac{V}{10^{-10} A}\right) I_X; S_2 \text{ \& } S_3 \text{ closed} \\ -\left(1 \frac{V}{10^{-9} A}\right) I_X; S_2 \text{ to } S_4 \text{ closed} \\ -\left(1 \frac{V}{10^{-8} A}\right) I_X; S_2 \text{ to } S_5 \text{ closed} \end{cases}$$

The current is then numerically integrated as in (27) to accomplish the measurement of $Q_X$.

$$Q_X = \int I_X dt \quad (27)$$

Figure 13:
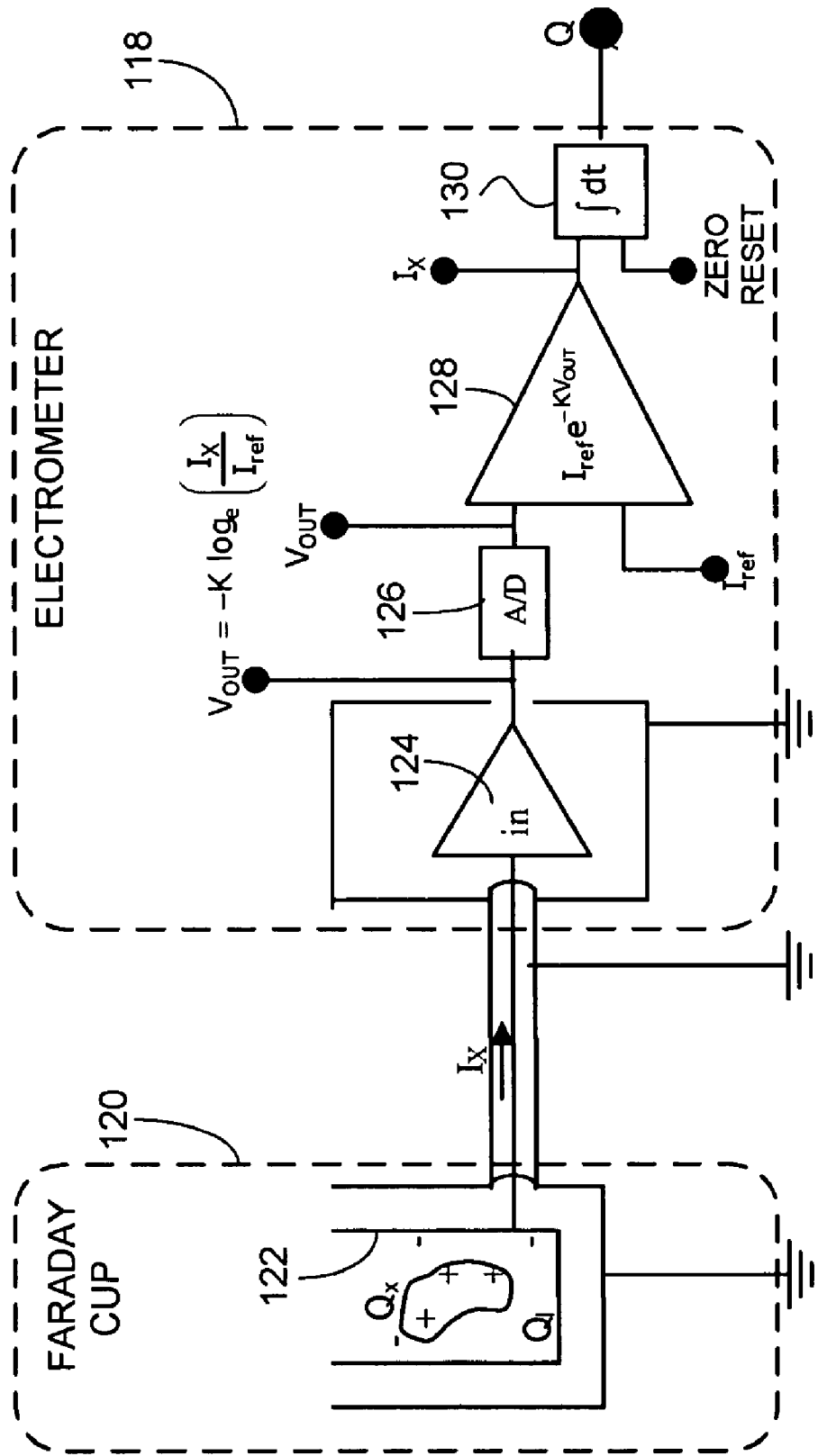

FIG. 13 schematically illustrates another embodiment of an electrometer 118. When the object with electrostatic charge $Q_X$ to be measured is placed inside the Faraday cup 120, an image charge $Q_I$ is induced on the Inner Sensing Electrode 122. The induced image charge causes current $I_X$ to flow into the input of the terminal of the logarithmic amplifier 124. The logarithmic amplifier 124 detects this current and produces an output voltage $V_{OUT}$ proportional to $\log_e(I_X)$. $V_{OUT}$ is digitized by the A/D converter 126, scaled, and integrated to determine $Q_X$.

Logarithmic amplifiers have very wide dynamic range. For example, the Texas Instruments LOG114 has an operating voltage of ±5V and input current range of 8 decades (100 pA to 10 mA). No switching of feedback components is needed in the embodiment of FIG. 13 since the amplifier has sufficient dynamic range. The output voltage is digitized by the A/D converter 126. The current $I_X$ can be computed 128 and integrated 130 to accomplish the measurement of $Q_X$. When using a logarithmic amplifier, an integrating capacitor cannot be used because the output voltage of the amplifier is not proportional to $I_X$. The more complex computation 128 (calculation of an exponential function) is required prior to integration.

Figure 14:
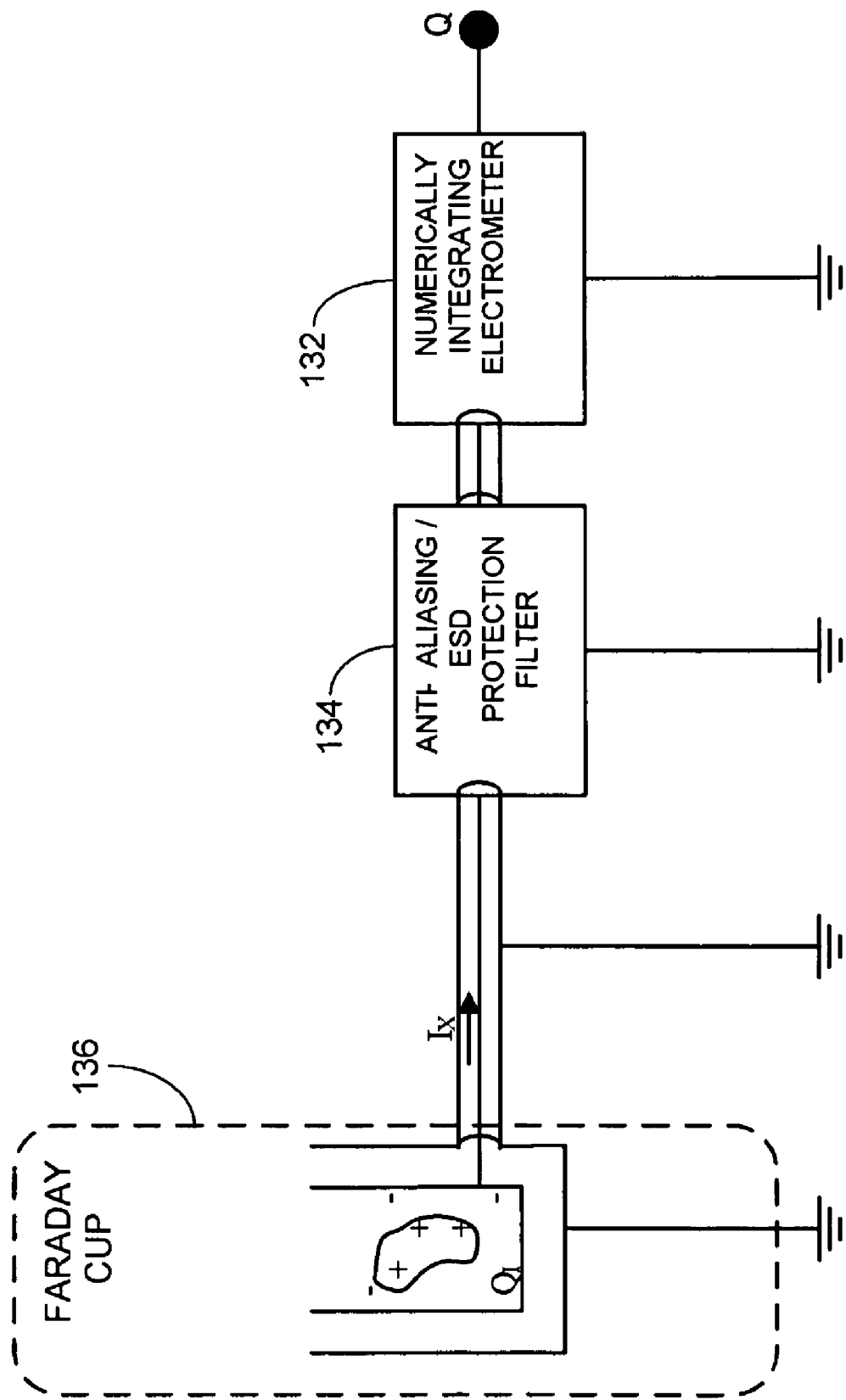
FIG. 14 schematically illustrates an embodiment of a numerically integrating electrometer having a combined anti-aliasing and electrostatic discharge protection filter.

FIG. 14 schematically illustrates an embodiment of a numerically integrating electrometer 132 having a combined anti-aliasing and electrostatic discharge protection filter 134. In other embodiments, there may be either an anti-aliasing filter or an electrostatic discharge protection filter, depending on the needs of the system. For the embodiment of FIG. 14, the filter 134 between the Faraday cup 136 and the input to the numerically integrating electrometer 132 serves two purposes. First, the frequency spectrum of the input to the numerical integrator is limited to frequencies below the Nyquist frequency. Second, sensitive electronic components in the electrometer 132 are protected from electrostatic discharge (ESD) events or sparks.

Figure 15:
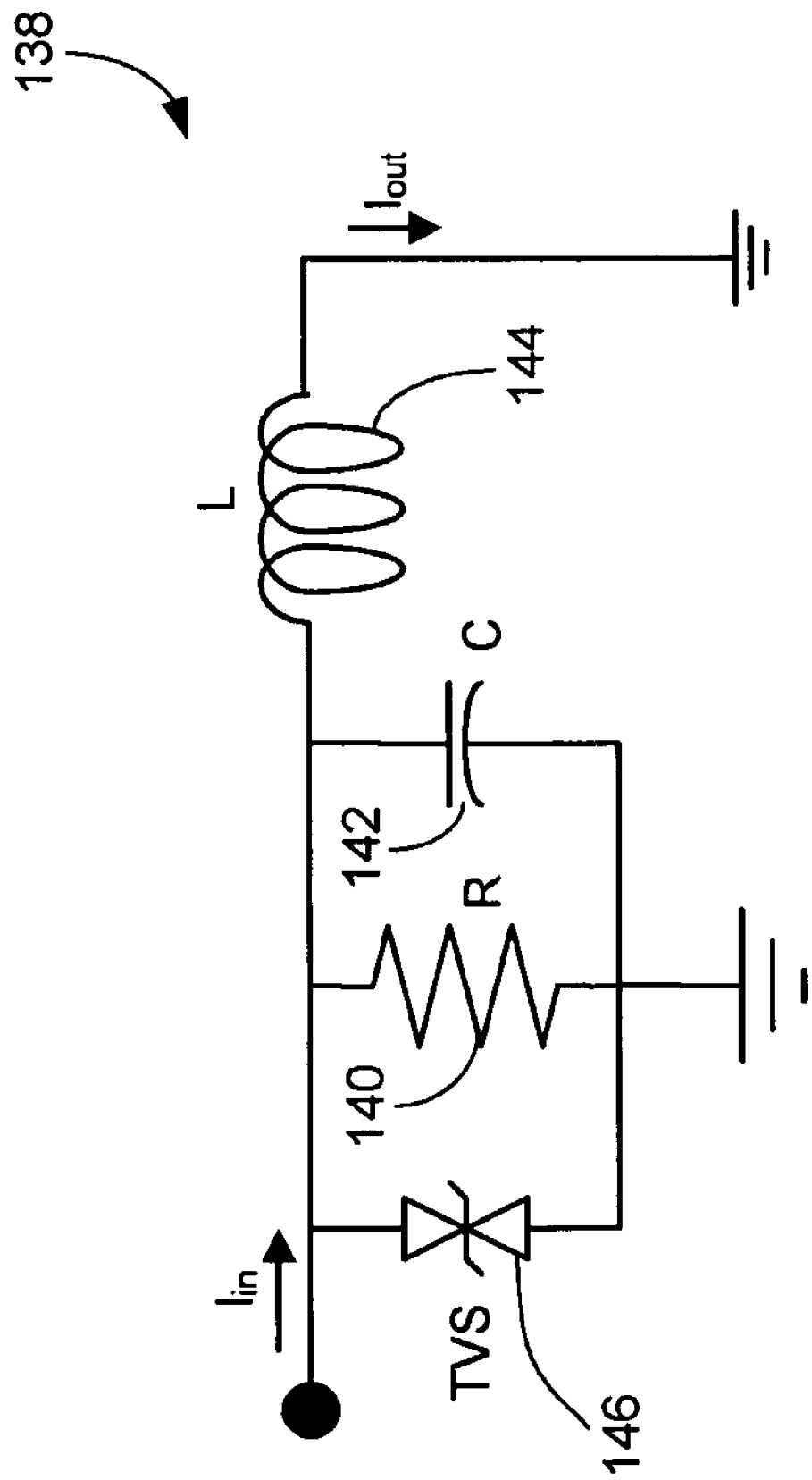
FIG. 15 schematically illustrates an embodiment of a combined anti-aliasing and electrostatic discharge protection filter.

FIG. 15 schematically illustrates an embodiment of a combined anti-aliasing and electrostatic discharge protection filter 138. The filter 138 has a shunt resistor 140 and a shunt capacitor 142 in parallel with the shunt resistor 140. An inductor 144 is coupled between a non-grounded side of the shunt resistor 140 and the input of an amplifier in the electrometer (not illustrated in this view). This passive, 2nd order, low pass filter 138 is preferably constructed of components robust against energetic ESD events (sparks). Furthermore, a transient voltage suppressor (TVS) 146 clamps the input voltage to fixed, low voltage. Component values may preferably be chosen for a maximally flat response (Butterworth Filter) with a cut-off frequency no higher than the Nyquist frequency.

As just one example of how the filter 138 could be designed, consider the following example, where a passive, 2nd order, low-pass filter is designed to achieve 3 objectives:

1. The cut-off frequency is chosen to be half the Nyquist frequency. If the A/D converter in the numerically integrating electrometer is clocked at 100 KHz, the Nyquist frequency is 50 KHz and the filter will have a design cut-off frequency of 50 KHz.

2. Resistor R will be chosen to provide maximally flat (Butterworth) response.

3. The individual components must be chosen to be robust against energetic current pulses characteristic of ESD events (sparks) that commonly occur when measuring electrostatic charge.

The transfer function for the circuit shown in FIG. 10 is given in (28).

$$\frac{I_{out}}{I_{in}} = \frac{\frac{1}{LC}}{s^2 + s\left(\frac{1}{RC}\right) + \frac{1}{LC}} \quad (28)$$

The cut-off frequency is given in (29)

$$f_{cut-off} = \frac{1}{2\pi\sqrt{LC}} \cong 50 \text{ KHz} \quad (29)$$

The resistor is chosen to provide maximally flat response.

$$R_{max flat} = \sqrt{\frac{L}{2C}} \quad (30)$$

Shown in Table 6 are the component values for one implementation of the filter shown illustrated in FIG. 15.

TABLE 6

Anti-Aliasing/ESD Protection Filter Values

| Component | Value | | Comments |
|---|---|---|---|
| $f_{cut\text{-}off}$ | 50 | KHz | |
| C | 0.1 | μF | |
| L | 0.101 | mH | J. W. Miller 2312-V-RC, toroidal, high current inductor |
| R | 22.5 | Ω | |
| Z | ±15 | volts | 1N6385, 1500 Watt Peak Power, Zener Transient Voltage Suppressor |

It is desirable to use a filter with the highest possible cut-off frequency that satisfies the design criteria. The higher cut-off frequency enables the design to use smaller inductors with lower coupling capacitance resulting in higher self-resonant frequencies. This is desirable for effective ESD protection. A low-pass filter with a cut-off frequency of 100 KHz should provide effective ESD protection. Most of the electrical energy in ESD events (sparks) is at high frequency (greater than 1 MHz) since the sparks last for only a few nanoseconds ($10^{-9}$ s).

Having thus described several embodiments of the claimed invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and the scope of the claimed invention. Additionally, the recited order of the processing elements or sequences, or the use of numbers, letters, or other designations therefore, is not intended to limit the claimed processes to any order except as may be specified in the claims. Accordingly, the claimed invention is limited only by the following claims and equivalents thereto.

What is claimed is:

1. An electrometer, comprising:
   a high gain differential amplifier having a first input, a second input, and an output;
   a first capacitor having a first terminal and a second terminal;
   said first terminal of said first capacitor is connected to said first input of said high gain differential amplifier;
   said second terminal of said first capacitor is connected to said output of said high gain differential amplifier;
   a first switch having a first terminal and a second terminal;
   said first terminal of said first switch is connected to said first input of said high gain differential amplifier;
   said second terminal of said first switch is connected to said output of said high gain differential amplifier;
   a second capacitor having a first terminal and a second terminal;
   said first terminal of said second capacitor is connected to said first input of said high gain differential amplifier;
   a second switch having a first terminal and a second terminal;
   said first terminal of said second switch is connected to said second terminal of said second capacitor;
   said second terminal of said second switch is connected to said output of said high gain differential amplifier; and
   said second input of said high gain differential amplifier is connected to ground potential.

2. The electrometer of claim 1, further comprising a sensing electrode coupled to the first input of the high gain differential amplifier.

3. The electrometer of claim 2, further comprising a shielded electrode for the sensing electrode.

4. The electrometer of claim 1, further comprising a plurality of capacitors each having a first terminal and a second terminal;
   said first terminal of each capacitor is connected to said first input of said high gain differential amplifier;
   a plurality of switches each having a first terminal and a second terminal there being one switch for each said capacitor and each switch is paried with one of said plurality of capacitors;
   said first terminal of each switch is connected to said second terminal of its said pared capacitor; and
   said second terminal of each said switch is connected to said output of said high gain differential amplifier.

5. The electrometer of claim 1, wherein a charge measured by the electrometer prior to closing said second switch is proportional to a voltage of the high gain differential amplifier output multiplied by said first capacitance, and;
   a charge measured by the electrometer after closing said second switch is proportional to a voltage of the high gain differential amplifier output multiplied by the sum of said first capacitance and said second capacitance.

6. The electrometer of claim 1, further comprising an electrostatic discharge protection circuitry coupled to the first input of the high gain differential amplifier wherein the electrostatic discharge protection circuitry comprises:
   a shunt resistor;
   a shunt capacitor in parallel with the shunt resistor; and
   an inductor coupled between a non-grounded side of the shunt resistor and the input of the high gain differential amplifier.

* * * * *